(12) United States Patent
Nakamura

(10) Patent No.: US 6,907,098 B2
(45) Date of Patent: Jun. 14, 2005

(54) GRAY CODE COUNTER

(75) Inventor: Hisashi Nakamura, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/284,254

(22) Filed: Oct. 31, 2002

(65) Prior Publication Data

US 2003/0179848 A1 Sep. 25, 2003

(30) Foreign Application Priority Data

Mar. 25, 2002 (JP) ........................................ 2002-084264

(51) Int. Cl.$^7$ .............................................. H03K 21/00
(52) U.S. Cl. .............................. 377/34; 377/49; 377/111
(58) Field of Search ............................. 377/34, 49, 111

(56) References Cited

U.S. PATENT DOCUMENTS

| | | | | |
|---|---|---|---|---|
| 5,027,310 A | * | 6/1991 | Dalrymple | ................ 708/672 |
| 5,754,614 A | * | 5/1998 | Wingen | ..................... 377/34 |
| 6,314,154 B1 | * | 11/2001 | Pontius | ..................... 377/16 |
| 6,337,893 B1 | * | 1/2002 | Pontius | ..................... 377/108 |

FOREIGN PATENT DOCUMENTS

JP 06-53818 2/1994

\* cited by examiner

*Primary Examiner*—Margaret R Wambach
(74) *Attorney, Agent, or Firm*—Rabin & Berdo, P.C.

(57) ABSTRACT

A Gray code counter includes a holding circuit, first and second conversin circuit and an operation circuit. The holding circuit stores gray code signals and outputs the stored gray code signals in response to a clock signal. The first conversion circuit receives the gray code signals from the holding circuit and converts the received gray code signals into first binary code signals. The operation circuit applies a logical operation to the first binary code signals so as to generate second binary code signals. The second conversion circuit receives the second binary code signals and converts the received second binary code signals into the gray code signals. The second conversion circuit outputs the gray code signals to the holding circuit.

19 Claims, 5 Drawing Sheets

FIG. 7

GRAY CODE TABLE

| DECIMAL EXPRESSION | GRAY CODE | | | | |
|---|---|---|---|---|---|
| | g4 | g3 | g2 | g1 | g0 |
| 0 | 0 | 0 | 0 | 0 | 0 |
| 1 | 0 | 0 | 0 | 0 | 1 |
| 2 | 0 | 0 | 0 | 1 | 1 |
| 3 | 0 | 0 | 0 | 1 | 0 |
| 4 | 0 | 0 | 1 | 1 | 0 |
| 5 | 0 | 0 | 1 | 1 | 1 |
| 6 | 0 | 0 | 1 | 0 | 1 |
| 7 | 0 | 0 | 1 | 0 | 0 |
| 8 | 0 | 1 | 1 | 0 | 0 |
| 9 | 0 | 1 | 1 | 0 | 1 |
| 10 | 0 | 1 | 1 | 1 | 1 |
| 11 | 0 | 1 | 1 | 1 | 0 |
| 12 | 0 | 1 | 0 | 1 | 0 |
| 13 | 0 | 1 | 0 | 1 | 1 |
| 14 | 0 | 1 | 0 | 0 | 1 |
| 15 | 0 | 1 | 0 | 0 | 0 |
| 16 | 1 | 1 | 0 | 0 | 0 |
| 17 | 1 | 1 | 0 | 0 | 1 |
| 18 | 1 | 1 | 0 | 1 | 1 |
| 19 | 1 | 1 | 0 | 1 | 0 |
| 20 | 1 | 1 | 1 | 1 | 0 |
| 21 | 1 | 1 | 1 | 1 | 1 |
| 22 | 1 | 1 | 1 | 0 | 1 |
| 23 | 1 | 1 | 1 | 0 | 0 |
| 24 | 1 | 0 | 1 | 0 | 0 |
| ⋮ | | | | | |

GRAY CODE COUNTER

BACKGROUND OF THE INVENTION

The present invention relates to a Gray code counter that counts a clock signal and outputs a Gray code corresponding to a counted value of the clock signal.

The Gray code is a kind of binary representation, and is called a reflected binary code, in which the hamming distance of two adjacent numbers is designed to be 1 as shown in Table 1 of FIG. 7.

When the Gray code is applied to the output signal for a counter, for example, that outputs a value sequentially increasing by 1 at a time synchronously with the clock signal, signal variations during the up counting are limited to only one bit, and noises during the variations are limited accordingly, which is a notable feature of the Gray code. A general binary counter has a possibility to output an incorrect value momentarily during signal variations, due to a delay time difference between the signals of each bit; however, the Gray code counter does not have such a possibility, thus facilitating to design a circuit pattern, which is another feature.

FIG. 2 is a circuit diagram of a conventional Gray code counter, which is disclosed in the Japanese Published Unexamined Patent Application No. Hei 6-53818.

The Gray code counter includes a holding circuit 1 composed of plural D type flip-flops (hereunder, referred to as "DFF") that hold signals D0 through D3 supplied to the inputs of the holding circuit 1 synchronously with a clock signal CLK, and output them as output signals Q0 through Q3, and a logic circuit 2 that handles the output signals from the holding circuit 1 as the values of the Gray code, generates signals of the Gray code corresponding to the values larger by 1 than these, and outputs the result as the signals D0 through D3.

The logic circuit 2 is configured to function as the up counter of the Gray code by making a complicated combination of logic gates, such as an exclusive logic sum gate (hereunder, "EOR"), logic sum gate (hereunder, "OR"), logic product gate (hereunder, "AND"), inverter (hereunder, "INV"), and so forth.

In the Gray code counter, when the clock signal CLK is given, the signals D0 through D3 that have been generated by the logic circuit 2 are held by the holding circuit 1 synchronously with the clock signal CLK, which are outputted as the output signals Q0 through Q3.

Inverted signals /Q0 through /Q3 of the output signals Q0 through Q3 outputted from the holding circuit 1 are also inputted to the logic circuit 2. The logic circuit 2 generates the Gray code corresponding to values lager by 1 than the values of the Gray code having been given by the holding circuit 1, and outputs the result as the signals D0 through D3.

And, when the next clock signal CLK is given, the signals D0 through D3 that have been generated by the logic circuit 2 are held by the holding circuit 1 synchronously with the clock signal CLK, which are outputted as the output signals Q0 through Q3. Thereby, the Gray code counter is able to output the Gray code that sequentially counts up synchronously with the clock signal CLK.

However, in the conventional Gray code counter, as shown by the logic circuit 2 in FIG. 2, there is a lack of regularity in the configuration of the logic gates that generates the signals D0 through D3 on the basis of the inverted signals /Q0 through /Q3 given by the holding circuit 1.

Therefore, if there is a need to design a Gray code counter having an arbitrary bit-number (especially, multiple bits), a new logic gate configuration to comply with a desired bit number will have to be designed. Accordingly, as the bit number increases, the circuit design requires more time and the circuit configuration becomes more complicated, so that the pattern of the integrated circuit cannot be simplified, which presents a problem to be solved.

SUMMARY OF THE INVENTION

The invention provides a Gray code counter with a simple circuit configuration, whereby a circuit with an arbitrary bit number can be designed with ease.

A Gray code counter of the present invention includes a holding circuit, first and second conversion circuits and an operation circuit. The holding circuit stores gray code signals and outputs the stored gray code signals in response to a clock signal. The first conversion circuit receives the gray code signals from the holding circuit and converts the received gray code signals into first binary code signals. The operation circuit applies a logical operation to the first binary code signals so as to generate second binary code signals. The second conversion circuit receives the second binary code signals and converts the received second binary code signals into the gray code signals. The second conversion circuit outputs the gray code signals to the holding circuit.

BRIEF DESCRIPTION OF THE DRAWINGS

FIG. 7 is the Gray code table.

PREFERRED EMBODIMENT OF THE INVENTION

First Embodiment

Figure 1:
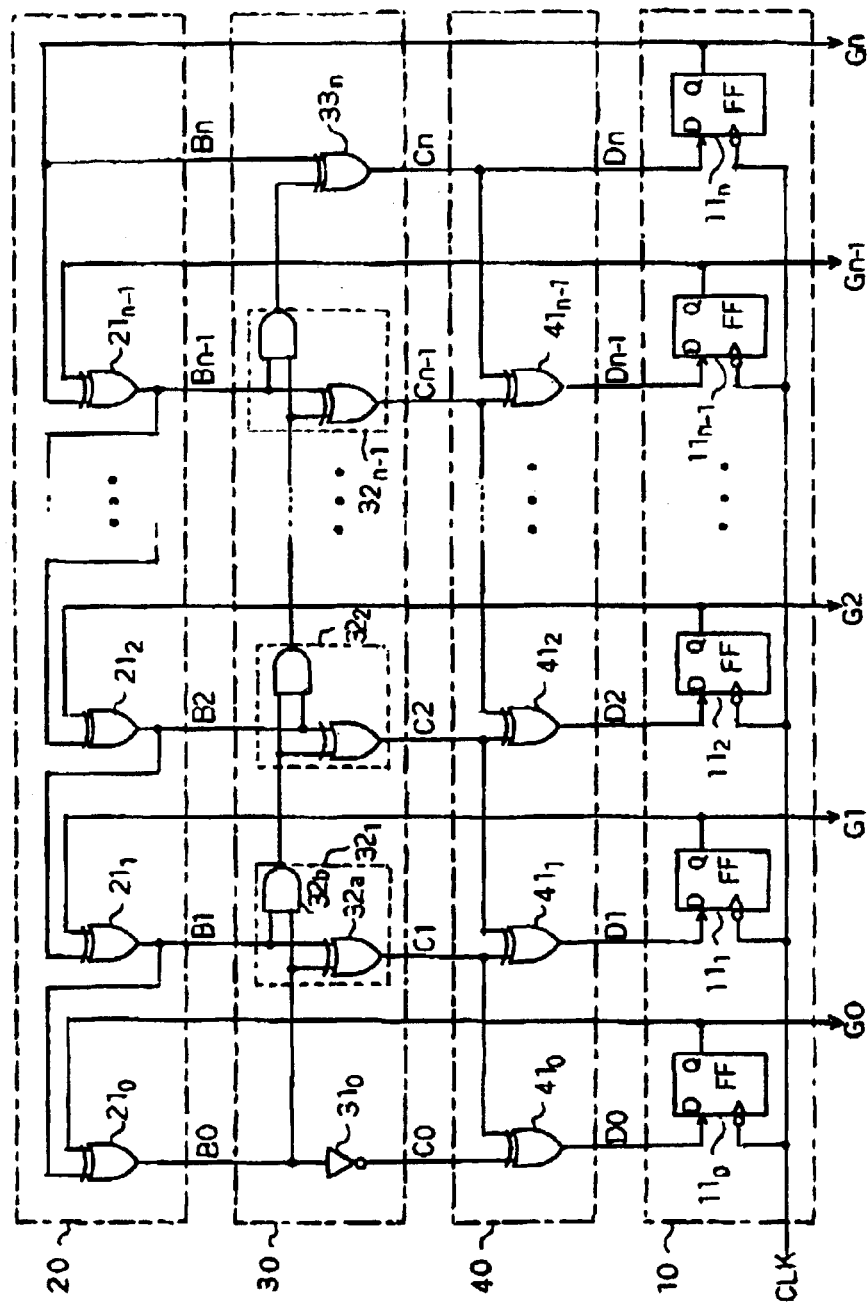
FIG. 1 is a circuit diagram of a Gray code counter relating to the first embodiment of the present invention.
Figure 2:
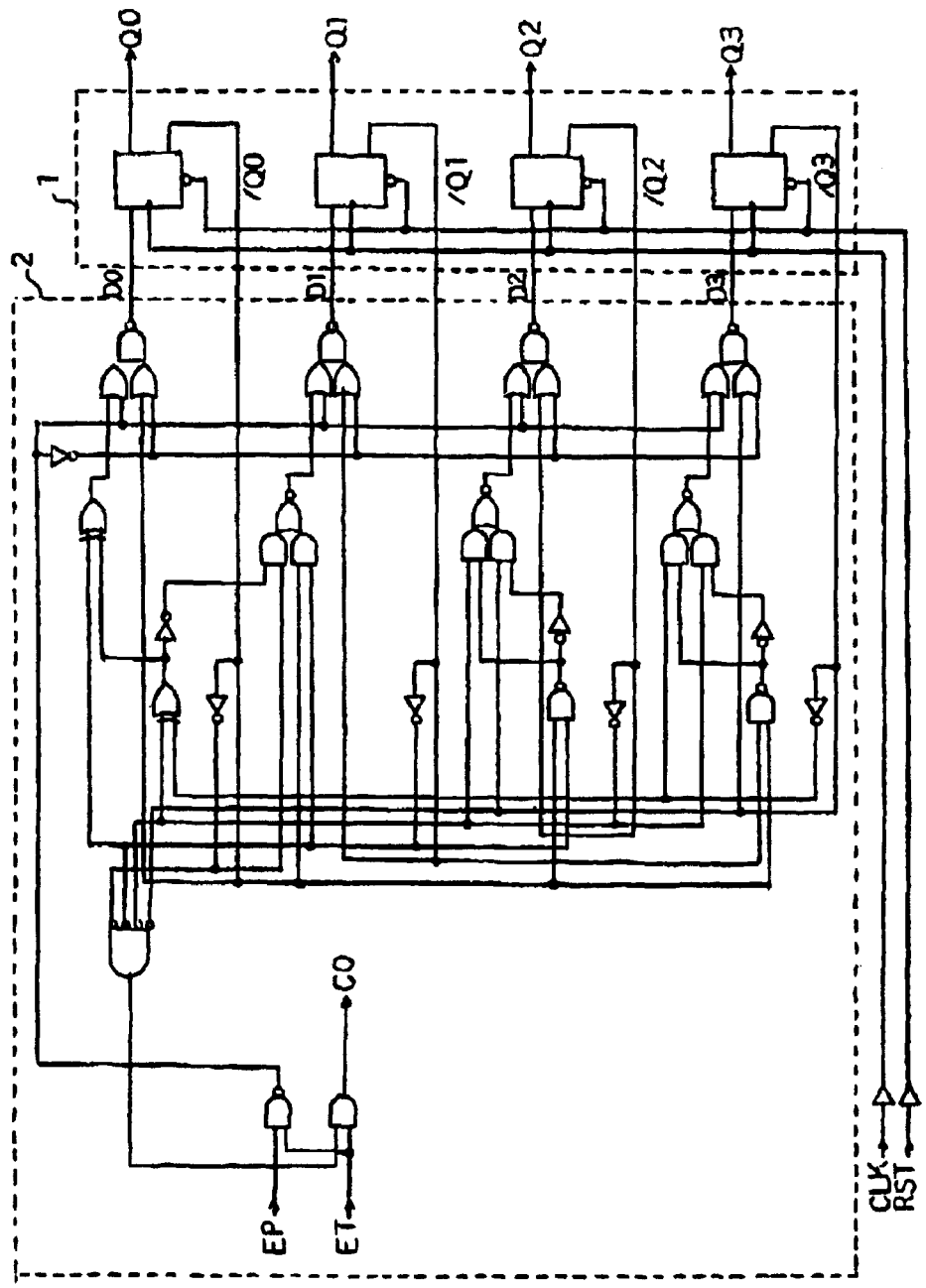
FIG. 2 is a circuit diagram of a conventional Gray code counter.

FIG. 1 is a circuit diagram of a Gray code counter relating to the first embodiment of the invention.

The Gray code counter includes a holding means (for example, holding circuit) 10, a first conversion means (for example, Gray-binary conversion circuit) 20, an operation means (for example, binary operation circuit) 30, and a second conversion means (binary-Gray conversion circuit) 40.

The holding circuit 10 holds n+1 bit Gray code signals D0, D1, . . . , Dn given by the binary-Gray conversion circuit 40 at the falling timing of a clock signal CLK, and outputs them as output signals G0, G1, . . . , Gn. The holding circuit 10 possesses $DFF11_0$, $DFF11_1$, . . . , $DFF11_n$ corresponding to each bit. The clock signal CLK is commonly given to these $DFF11_0$, $DFF11_1$, . . . , $DFF11_n$.

The Gray-binary conversion circuit 20 converts the Gray code output signals G0, G1, . . . , Gn outputted by the holding circuit 10 into the binary numbers, and outputs the converted results as signals B0, B1, . . . , Bn. The Gray-binary conversion circuit 20 is made up with $EOR21_0$, $EOR21_1, \ldots, EOR21_{n-1}$ in correspondence with bit 0 through bit n−1 except the most significant bit n, and the output signal Gn given by the holding circuit 10 is outputted as the signal Bn as it is. $EOR21_{n-1}$ executes the exclusive OR operation to the signal Bn and the output signal Gn−1 given by the holding circuit 10 to generate the signal Bn−1. In the same manner, $EOR21_i$ (i=n−2, n−3, . . . , 0) executes the exclusive OR operation to the signal Bi+1 and the output signal Gi to generate the signal Bi. The Gray-binary conversion circuit 20 is well known as the Gray-to-binary conversion circuit.

The binary operation circuit 30 adds 1 to the binary signals B0, B1, . . . , Bn outputted by the Gray-binary conversion circuit 20, and outputs the added results as signals C0, C1, . . . , Cn. The binary operation circuit 30 possesses an inverter $31_0$ that inverts the signal B0 of the least significant bit 0 to output the signal C0, adding circuits $32_j$ (j=1, 2, . . . , n−1) corresponding to the intermediate bit 1 through bit n−1, and an $EOR33_n$ corresponding to the most significant bit n.

Each of the adding circuits $32_j$ is composed of an EOR32a and an AND32b. In each of the adding circuits $32_j$, EOR32a executes the exclusive OR operation to a carry signal given by the lower adding circuit $32_{j-1}$ and the signal Bj given by the Gray-binary conversion circuit 20 to generate the signal Cj. AND32b executes the logical product operation to the signal Bj and the lower carry signal, and outputs a carry signal to the upper adding circuit $32_{j+1}$. The adding circuit $32_1$ is given the signal B0 as a carry signal. Since the most significant bit n does not need to output a carry signal, $EOR33_n$ executes the exclusive OR operation to the carry signal given by the adding circuit $32_{n-1}$ and the signal Bn given by the Gray-binary conversion circuit 20, and generates the signal Cn. This type of binary operation circuit 30 is well known as the increment circuit.

The binary-Gray conversion circuit 40 converts the binary signals C0, C1, . . . , Cn outputted by the binary operation circuit 30 into the Gray code, and outputs the converted results as signals D0, D1, . . . , Dn. The binary-Gray conversion circuit 40 is made up with $EOR41_0$, $EOR41_1, \ldots, EOR41_{n-1}$ in correspondence with bit 0 through bit n−1 except the most significant bit n. $EOR41_i$ (i=0, 1, . . . , n−1) executes the exclusive OR operation to the signal Ci and the signal Ci+1 to generate the signal Di. The output signal Cn given by the binary operation circuit 30 is outputted as the signal Dn as it is. The binary-Gray conversion circuit 40 is well known as the binary-to-Gray conversion circuit.

Next, the operation of the Gray code counter will be explained.

The data being held by $DFF11_0$, $DFF11_1, \ldots, DFF11_n$ of the holding circuit 10 are outputted each as the output signals G0, G1, . . . , Gn. The output signals G0, G1, . . . , Gn are given to the Gray-binary conversion circuit 20, and they are converted into the binary numbers by the Gray-binary conversion circuit 20, and the binary signals B0, B1, . . . , Bn corresponding to the Gray code are outputted. Next, the signals B0, B1, . . . , Bn are given to the binary operation circuit 30, which adds 1 to the signals B0, B1, . . , Bn to produce the signal C0, C1, . . . , Cn as the added results.

The binary signals C0, C1, . . . , Cn are given to the binary-Gray conversion circuit 40, and the signals D0, D1, . . . , Dn having been converted into the Gray code by the binary-Gray conversion circuit 40 are outputted. The signals D0 through Dn are given to the inputs of the $DFF11_0$ through $DFF11_n$ of the holding circuit 10. Therefore, the signals D0 through Dn given to the inputs of the $DFF11_0$ through $DFF11_n$ of the holding circuit 10 are the Gray code signals being larger by 1 than the output signals G0 through Gn of the Gray code that are held and outputted by the $DFF11_0$ through $DFF11_n$ of the holding circuit 10.

When the clock signal CLK falls, the signals D0 through Dn are held by the $DFF11_0$ through $DFF11_n$ of the holding circuit 10, and are outputted as the output signals G0 through Gn. Thereby, the output signals G0 through Gn of the Gray code increase by 1.

The output signals G0 through Gn are given to the Gray-binary conversion circuit 20 at the same time; and the signals D0 through Dn of the Gray code that are larger by 1 are generated by the Gray-binary conversion circuit 20 and the binary operation circuit 30 and binary-Gray conversion circuit 40 that are connected in continuation to the former.

Therefore, by setting the period of the clock signal CLK longer than a total processing time of the Gray-binary conversion circuit 20, binary operation circuit 30, and binary-Gray conversion circuit 40, the output signals D0 through Dn of the Gray code can be attained which increase sequentially by 1 at a time.

As mentioned above, the Gray code counter of the first embodiment is formed by the holding circuit 10, Gray binary conversion circuit 20, binary operation circuit 30, and binary-Gray conversion circuit 40, which can be configured by connecting the same circuits for necessary bits.

In other words, the Gray code counter is configured with three kinds of blocks by each output bit, as illustrated in FIG. 1.

The first block is a least significant bit block, which is composed of the $DFF11_0$ that holds the output signal G0, the $EOR21_0$ that outputs the signal B0, the $INV31_0$ that outputs the signal C0, and the $EOR41_0$ that outputs the signal D0. The second block is an intermediate bit block, which is composed of the $DFF11_j$ that holds the output signal Gj (j=1~n−1), the $EOR21_j$ that outputs the signal Bj, the adding circuit $32_j$ that outputs the signal Cj, and the $EOR41_j$ that outputs the signal Dj. The third block is a most significant bit block, which is composed of the $DFF11_n$ that holds the output signal Gn, and the $EOR33_n$ that outputs the signal Cn.

Thus, in order to expand the Gray code counter into that of an arbitrary bit number, it is only needed to add the intermediate bit blocks by necessary number, between the least significant bit block and the most significant bit block.

In this manner, according to the Gray code counter of this embodiment, a circuit of an arbitrary bit number that has a simple circuit construction can be designed easily, which is advantageous. Also, in the layout designing of an integrated circuit, designing the three kinds of blocks will make it possible to configure a Gray code counter of an arbitrary bit number by only arraying the same circuit patterns. Therefore, redoing the layout design or design imperfections can be reduced, which is advantageous.

Second Embodiment

Figure 3:
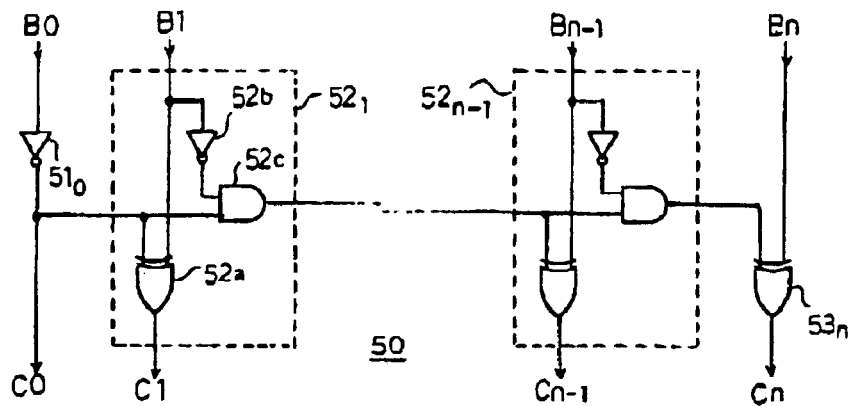
FIG. 3 is a circuit diagram of a binary operation circuit relating to the second embodiment of the invention.

FIG. 3 illustrates a binary operation circuit of the second embodiment.

The binary operation circuit 50 is provided in replacement for the binary operation circuit 30 in FIG. 1, which subtracts 1 from the binary signals B0, B1, . . . , Bn outputted by the Gray-binary conversion circuit 20, and outputs the subtracted results as signals C0, C1, . . . , Cn. The binary operation circuit 50 possesses an $INV51_0$ that inverts the signal B0 of the least significant bit 0 to output the signal C0, subtracting circuits $52_j$ (j=1, 2, . . . , n−1) corresponding to the intermediate bit 1 through bit n−1, and an $EOR53_n$ corresponding to the most significant bit n.

Each of the subtracting circuits $52_j$ is composed of an EOR52a, an INV52b, and an AND52c. In each of the subtracting circuits $52_j$, the EOR52a executes the exclusive OR operation to a borrow signal given by the lower subtracting circuit $52_{j-1}$ and the signal Bj given by the Gray-binary conversion circuit 20 to generate the signal Cj. And, the AND52c executes the logical product operation to the signal Bj inverted by the INV52b and the lower borrow signal, and outputs a borrow signal to the upper subtracting circuit $52_{j+1}$.

The subtracting circuit $52_1$ is given the signal C0 as a borrow signal. Since the most significant bit n does not need to output a borrow signal, the $EOR53_n$ executes the exclusive OR operation to the borrow signal given by the subtracting circuit $52_{n-1}$ and the signal Bn given by the Gray-binary conversion circuit 20, and generates the signal Cn. This type of binary operation circuit 50 is well known as the decrement circuit.

Thus, in the binary operation circuit 50 of the second embodiment, the subtracting circuits $52_1$ through $52_{n-1}$ having the same circuit configuration are connected for a necessary bit number so as to subtract the binary values by 1. Therefore, employing the binary operation circuit 50 in replacement for the binary operation circuit 30 in FIG. 1 will configure a down counter having the same advantage as that of the first embodiment.

Third Embodiment

Figure 4:
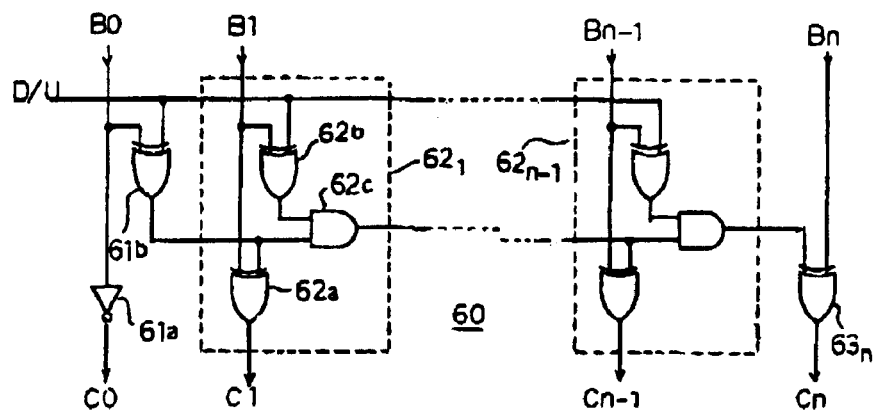
FIG. 4 is a circuit diagram of a binary operation circuit relating to the third embodiment of the invention.

FIG. 4 illustrates a binary operation circuit of the third embodiment.

The binary operation circuit 60 is provided in replacement for the binary operation circuit 30 in FIG. 1, which increments or decrements the binary signals B0, B1, . . . , Bn outputted by the Gray-binary conversion circuit 20 according to a control signal D/U, and outputs the results as signals C0, C1, . . . , Cn. The binary operation circuit 60 possesses an inverter 61a that inverts the signal B0 of the least significant bit 0 to output the signal C0, an EOR61b that executes the exclusive OR operation to the signal B0 and the control signal D/U, adding/subtracting circuits $62_j$ (j=1, 2, . . . , n−1) corresponding to the intermediate bit 1 through bit n−1, and an $EOR63_n$ corresponding to the most significant bit n.

Each of the adding/subtracting circuits $62_j$ is composed of an EOR62a and an EOR62b, and an AND62c. In each of the adding/subtracting circuits $62_j$, the EOR62a executes the exclusive OR operation to a carry or borrow signal given by the lower adding/subtracting circuit $62_{j-1}$ and the signal Bj given by the Gray-binary conversion circuit 20 to generate the signal Cj. The EOR62b executes the exclusive OR operation to the signal Bj and the control signal D/U. The AND62c executes the logical product operation to an output signal from the EOR62b and a carry or borrow signal given by the lower adding/subtracting circuit $62_{j-1}$, and outputs a carry or borrow signal to the upper adding/subtracting circuit $62_{j+1}$.

The adding/subtracting circuit $62_1$ is given an output signal from the EOR61b as a carry or borrow signal. Since the most significant bit n does not need to output a carry or borrow signal, the $EOR63_n$ executes the exclusive OR operation to the carry or borrow signal given by the adding/subtracting circuit $62_{n-1}$ and the signal Bn given by the Gray-binary conversion circuit 20, and generates the signal Cn.

In the binary operation circuit 60, when the control signal D/U is in "L" level, the EOR 61b and the EOR 62b in each of the adding/subtracting circuits 62j function as a simple buffer. Thereby, the binary operation circuit 60 will have the same logic configuration as that of the binary operation circuit 30 in FIG. 1, and operates as the increment circuit.

On the other hand, when the control signal D/U is in "H" level, the EOR 61b and the EOR 62b in each of the adding/subtracting circuits 62j function as an inverter. Thereby, the binary operation circuit 60 will have the same logic configuration as that of the binary operation circuit 50 in FIG. 3, and operates as the decrement circuit. This type of binary operation circuit 60 is well known as the adding/subtracting circuit.

Thus, in the binary operation circuit 60 of the third embodiment, the adding/subtracting circuits $62_1$ through $62_{n-1}$ having the same circuit configuration are connected for a necessary bit number so as to add or subtract the binary values by 1 in accordance with the control signal D/U. Therefore, employing the binary operation circuit 60 in replacement for the binary operation circuit 30 in FIG. 1 will configure an up-and-down counter having the same advantage as that of the first embodiment.

Fourth Embodiment

Figure 5:
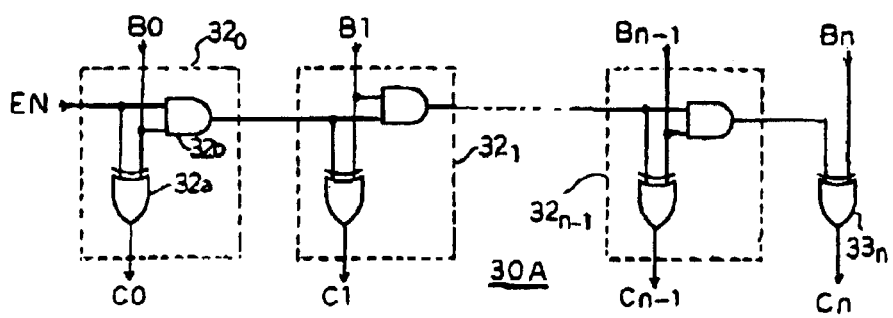
FIG. 5 is a circuit diagram of a binary operation circuit relating to the fourth embodiment of the invention.

FIG. 5 illustrates a binary operation circuit of the fourth embodiment.

The binary operation circuit 30A is provided in replacement for the binary operation circuit 30 in FIG. 1, in which the common components in these drawings are given the common symbols.

In the binary operation circuit 30A, in replacement for the $INV31_0$ corresponding to the least significant bit 0 in FIG. 1, an adding circuit $32_0$ is provided which has the same configuration as one for the intermediate bit 1 through bit n−1. That is, the adding circuit $32_0$ is composed of the EOR32a and the AND32b, and the binary signal B0 outputted by the Gray-binary conversion circuit 20 and an Enable signal EN are commonly given to the inputs of the EOR32a and the AND32b. And, the EOR32a and AND32b is designed to output the signal C0 and carry signal, respectively. The other configuration is the same as FIG. 1.

In the binary operation circuit 30A, when the Enable signal EN is in "L" level, the EOR32a in the adding circuit $32_0$ functions as a simple buffer. The output signal (namely, carry signal) from the AND32b in the adding circuit $32_0$ becomes "L" level, regardless of the signal B0. Thereby, the increment operation in the binary operation circuit 30A is inhibited, and the binary signals B0 through Bn given by the Gray-binary conversion circuit 20 are outputted as they are, as the signals C0 through Cn.

On the other hand, when the Enable signal EN is in "H" level, the EOR32a in the adding circuit $32_0$ functions as an inverter. The AND32b in the adding circuit $32_0$ functions as a simple buffer. Thereby, the binary operation circuit 30A will have the same logic configuration as that of the binary operation circuit 30 in FIG. 1, and operates as the increment circuit.

Thus, the binary operation circuit 30A of the fourth embodiment takes a construction that connects the adding circuits $32_0$ through $32_{n-1}$ having the same circuit configuration to the bit 0 through n−1, and controls the increment operation by giving the Enable signal EN to the adding circuit $32_0$. Therefore, employing the binary operation circuit 30A in replacement for the binary operation circuit 30 in FIG. 1 will configure an up counter with the Enable function, having the same advantage as that of the first embodiment.

Fifth Embodiment

Figure 6:
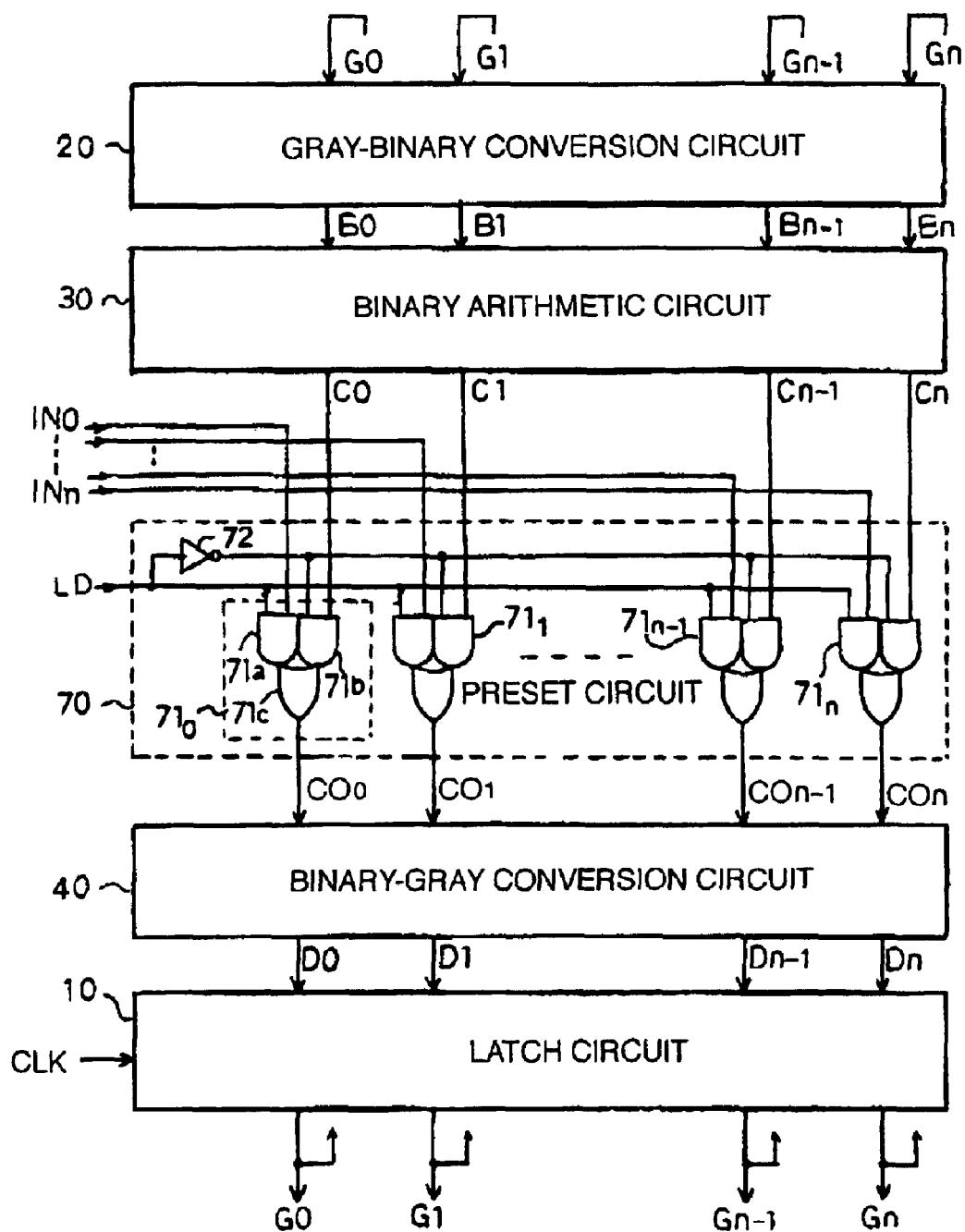
FIG. 6 is a block diagram of a Gray code counter relating to the fifth embodiment of the invention.

FIG. 6 is a block diagram of a Gray code counter of the fifth embodiment, in which the components common to the components in FIG. 1 are given the common symbols.

The Gray code counter takes a construction in which a selection means (for example, preset circuit) 70 is inserted between the binary operation circuit 30 and the binary-Gray conversion circuit 40.

The preset circuit 70 is to set initial values of the output signals G0 through Gn, and is given setting data IN0, IN1, . . . , INn based on the binary numbers and a selection signal LD (for example, load signal). The preset circuit 70 possesses selection circuits $71_0$, $71_1$, . . . , $71_n$ provided for each bit of each row. Each selection circuit $71_k$ (k=0, 1, . . . , n) configures a composite gate in which two-input ANDs 71a and 71b have a two-input OR71c connected on the outputs of these two-input ANDs.

The AND 71a of each selection circuit $71_k$ is given the setting data INk and the load signal LD to the inputs thereof, and the AND 71b is given the signal Ck from the binary operation circuit 30 and the load signal LD inverted by an inverter 72 to the inputs thereof. The OR71c of each selection circuit $71_k$ outputs the signal COk, which is given to the binary-Gray conversion circuit 40. The other construction is the same as FIG. 1.

In the Gray code counter, setting the load signal LD to "H" level will make each selection circuit $71_k$ of the preset circuit 70 select the setting data INk, which is outputted to the binary-Gray conversion circuit 40. Thereby, the setting data IN0 through INn based on the binary numbers are converted into the Gray codes, and are outputted to the holding circuit 10. Here, as the clock signal CLK falls, the holding circuit 10 holds the Gray codes corresponding to the setting data IN0 through INn, which are outputted as the output signals G0 through Gn of the initial values.

Thereafter, switching the load signal LD into "L" level will make each selection circuit $71_k$ of the preset circuit 70 select the signal Ck given by the binary operation circuit 30, which is outputted to the binary-Gray conversion circuit 40. The operation thereafter is the same as the first embodiment.

Thus, the Gray code counter of the fifth embodiment possesses the preset circuit 70 that switches the inputs by the load signal LD to set the initial values on the basis of the binary data supplied from the outside. Tn general, the control circuit to control a Gray code counter is designed based on the binary code. Therefore, if there were binary data to be preset in the Gray code counter, a conversion means to convert the binary code into the Gray code had to be provided outside the counter. This embodiment permits to preset binary data directly by the binary code, which achieves a Gray code counter that is easy to control. Moreover, an expansion of the bit number in the preset circuit 70 only needs to array a necessary number of the composite gates composed of the ANDs and OR, which makes it possible to make up an up counter with preset function that has the same advantage as the first embodiment.

The invention is not limited to the aforementioned embodiments, and various modifications are possible. There are following examples for the modifications.

(a) A construction may be formed to output the signals B0 through Bn that are outputted by the Gray-binary conversion circuit 20 in FIG. 1 or FIG. 6 to the outside. This construction will produce the binary output signals B0 through Bn as well as the Gray code output signals G0 through Gn. Therefore, if there is a control circuit that requires control signals based on the binary numbers, the circuit configuration of the control circuit can be simplified.

(b) In the binary operation circuit 30 in FIG. 1, the binary operation circuit 50 in FIG. 3, the binary operation circuit 60 in FIG. 4, there are variations in the circuits to the least significant bit 0 and the intermediate bit 1 through bit n–1.

However, as the circuit for the least significant bit 0 may be employed an adding circuit similar to those for the intermediate bit 1 through bit n–1. In that case, it is necessary to fix the input signals from the lower sides to an appropriate level. Also, as the circuit for the most significant bit n may be employed an adding circuit similar to those for the intermediate bit 1 through bit n–1. Thereby, it becomes possible to use a same circuit pattern to each row, and to simplify the patterning of the integrated circuit.

(c) A construction may be made to provide reset terminals to the $DFF11_0$ through $DFF11_n$ each in the holding circuit 10 illustrated in FIG. 1 or FIG. 6, so as to reset the holding contents by the reset signals.

(d) The binary operation circuit as illustrated in FIG. 3 through FIG. 5 may be provided in replacement for the binary operation circuit 30 in FIG. 6.

As the embodiments have been described in detail, the Gray code counter according to the invention includes a first conversion means that converts Gray code signals into binary code signals, an operation means that applies a specific operation to the binary code signals, a second conversion means that converts the results of the operation means into new Gray code signals, and a holding means that holds the new Gray code signals on the basis of a clock signal. These conversion means, operation means, and holding means can be made up with the same circuits that are connected by the necessary bit number. Accordingly, the circuit configuration is simplified, which facilitates to design the circuit of an arbitrary bit number.

According to the invention, a selection means that selects the binary code signals given from the outside or the binary code signals generated by the operation means can be provided between the operation means and the second conversion means. This produces an effect of setting arbitrary initial values.

According to the invention, it is also possible to control the counting operation by the Enable signal from the outside.

According to the invention, if a construction is designed to output the binary code signals as well as the Gray code signals, the circuit construction can be simplified in need of the control signals based on the binary numbers.

According to the invention, a Gray code counter can be made up with blocks composed of first and second conversion circuits, adding circuits, and holding circuits, where the blocks for n digits are connected in parallel to correspond with the Gray code signals of n digits. Thereby, only connecting the same blocks for the number of digits will make up a Gray code counter, which simplifies the circuit configuration and facilitates to design the circuit of, an arbitrary bit number.

What is claimed is:

1. A Gray code counter comprising:
   a holding circuit storing a plurality of gray code signals received thereto and outputting the stored gray code signals in response to a clock signal;
   a first conversion circuit receiving the gray code signals from the holding circuit and converting the received gray code signals into a plurality of first binary code signals;
   an operation circuit for applying a logical operation to the first binary code signals so as to generate a plurality of second binary code signals, the operation circuit generating one of the second binary code signals from two adjacent bits of the first binary code signals; and
   a second conversion circuit receiving the second binary code signals and converting the received second binary code signals back into gray code signals, which are output the gray code signals to the holding circuit, wherein the holding circuit, the operation circuit, and the first and second conversion circuits comprise a least significant bit block, a most significant bit block, and a plurality of intermediate bit blocks, the intermediate bit blocks having the same circuit configuration.

2. A Gray code counter as claimed in claim 1, wherein the operation circuit adds 1 to each of the first binary code signals so as to generate the second binary code signals.

3. A Gray code counter as claimed in claim 1, wherein the operation circuit subtracts 1 from each of the first binary code signals so as to generate the second binary code signals.

4. A Gray code counter as claimed in claim 1, wherein the operation circuit adds +1 or −1 to each of the first binary code signals in response to a control signal so as to generate the second binary code signals.

5. A Gray code counter as claimed in claim 1, wherein the operation circuit outputs the first binary code signals as the second binary code signals, when the operation circuit is enabled.

6. A gray code counter as claimed in claim 1, wherein the holding circuit includes a plurality of flip-flop circuits.

7. A gray code counter as claimed in claim 1, wherein each of the first and second conversion circuits includes a plurality of exclusive OR circuits.

8. A gray code counter as claimed in claim 1, wherein the operation circuit includes an inverter and a plurality of exclusive OR circuits and AND circuits.

9. A Gray code counter comprising:

a holding circuit storing a plurality of gray code signals received thereto and outputting the stored gray code signals in response to a clock signal;

a first conversion circuit receiving the gray code signals from the holding circuit and converting the received gray code signals into a plurality of first binary code signals;

an operation circuit for applying a logical operation to the first binary code signals so as to generate a plurality of second binary code signals;

a selection circuit for receiving a plurality of predetermined data signals, the selection circuit selecting the predetermined data signals or the second binary code signals in response to a selection signal; and a second conversion circuit receiving the signals from the selection circuit and converting the received signals back into gray code signals, which are output to the holding circuit.

10. A Gray code counter as claimed in claim 9, wherein the operation circuit adds 1 to each of the first binary code signals so as to generate the second binary code signals.

11. A Gray code counter as claimed in claim 9, wherein the operation circuit subtracts 1 from each of the first binary code signals so as to generate the second binary code signals.

12. A Gray code counter as claimed in claim 9, wherein the operation circuit adds +1 or −1 to each of the first binary code signals in response to a control signal so as to generate the second binary code signals.

13. A Gray code counter as claimed in claim 9, wherein the operation circuit outputs the first binary code signals as the second binary code signals, when the operation circuit is enabled.

14. A gray code counter as claimed in claim 9, wherein the holding circuit includes a plurality of flip-flop circuits.

15. A gray code counter as claimed in claim 9, wherein each of the first and second conversion circuits includes a plurality of exclusive OR circuits.

16. A gray code counter as claimed in claim 9, wherein the operation circuit includes an inverter and a plurality of exclusive OR circuits and AND circuits.

17. A gray code counter as claimed in claim 9, wherein the selection circuit includes an inverter and a plurality of exclusive OR circuits and AND circuits.

18. A Gray code counter including a first circuit block, a last circuit block, and n-2 intermediate circuit blocks each of which has the same circuit configuration, where n is a natural number and each of the intermediate circuit blocks comprises:

a first exclusive OR circuit for receiving an i-th bit of an n-digit gray code signal and an (i+1)-th bit of an n-digit binary code signal, and outputting an i-th bit of a binary code signal;

an adding circuit for adding the i-th bit of the binary code signal to a signal output from an (i−1)-th circuit block, and outputting an added result;

a second exclusive OR circuit for receiving the added result and a signal from and (i+1)-th circuit block, and outputting an i-th bit of gray code bit; and a holding circuit storing the i-th gray code bit and outputting the stored gray code bit in response to a clock signal.

19. A Gray code counter as claimed in claim 18, wherein the adding circuit receives an enable signal from the (i−1)-th circuit block.

* * * * *